United States Patent
Bao et al.

(10) Patent No.: US 10,128,372 B1
(45) Date of Patent: Nov. 13, 2018

(54) BOTTOM CONTACT RESISTANCE REDUCTION ON VFET

(71) Applicant: International Business Machines Corporation, Armonk, NY (US)

(72) Inventors: Ruqiang Bao, Wappingers Falls, NY (US); ChoongHyun Lee, Rensselaer, NY (US); Shogo Mochizuki, Clifton Park, NY (US); Hemanth Jagannathan, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/905,891

(22) Filed: Feb. 27, 2018

Related U.S. Application Data

(63) Continuation of application No. 15/596,634, filed on May 16, 2017, now Pat. No. 9,960,272.

(51) Int. Cl.
- H01L 29/78 (2006.01)
- H01L 29/66 (2006.01)
- H01L 29/06 (2006.01)
- H01L 29/417 (2006.01)

(52) U.S. Cl.
CPC ...... H01L 29/7827 (2013.01); H01L 29/0649 (2013.01); H01L 29/41741 (2013.01); H01L 29/6656 (2013.01); H01L 29/66666 (2013.01)

(58) Field of Classification Search
CPC ............ H01L 29/7827; H01L 29/6656; H01L 29/0649; H01L 29/66666; H01L 29/41741
See application file for complete search history.

(56) References Cited

U.S. PATENT DOCUMENTS

| | | | |
|---|---|---|---|
| 7,892,945 B2* | 2/2011 | Bedell | B82Y 10/00 438/445 |
| 8,969,149 B2* | 3/2015 | Leobandung | H01L 29/78609 257/18 |

OTHER PUBLICATIONS

List of Patents or Patent Applications Treated as Related; (Appendix P), filed Feb. 27, 2018; 2 pages.
Rugiang Bao et al., "Bottom Contact Resistance Reduction on VFET", U.S. Appl. No. 15/905,885, filed Feb. 27, 2018.
Rugiang Bao et al., "Bottom Contact Resistance Reduction on VFET", U.S. Appl. No. 15/596,634, filed May 16, 2017.

\* cited by examiner

*Primary Examiner* — Selim Ahmed
(74) *Attorney, Agent, or Firm* — Cantor Colburn LLP; Vazken Alexanian

(57) ABSTRACT

Embodiments are directed to a method and resulting structures for a vertical field effect transistor (VFET) having a reduced bottom contact resistance. A multilayered bottom doped region having alternating doped layers and doped sacrificial layers is formed on a substrate. One or more cavities are formed by removing portions of the doped sacrificial layers. A bottom contact is formed over the multilayered bottom doped region. The bottom contact includes one or more conductive flanges that fill the cavities.

20 Claims, 17 Drawing Sheets

BOTTOM CONTACT RESISTANCE REDUCTION ON VFET

DOMESTIC PRIORITY

This application is a continuation application of U.S. patent application Ser. No. 15/596,634, filed on May 16, 2017, the disclosure of which is incorporated by reference herein in its entirety.

BACKGROUND

The present invention generally relates to fabrication methods and resulting structures for semiconductor devices. More specifically, the present invention relates to bottom contact resistance reductions in vertical FETs (VFETs).

In contemporary semiconductor device fabrication processes, a large number of semiconductor devices, such as field effect transistors (FETs), are fabricated on a single wafer. Some non-planar transistor architectures, such as vertical field effect transistors (VFETs), employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

SUMMARY

Embodiments of the present invention are directed to a method for fabricating a semiconductor device. A non-limiting example of the method includes forming a multilayered bottom doped region having alternating doped layers and sacrificial layers on a substrate. One or more cavities are formed by removing portions of the doped sacrificial layers. A bottom contact is formed over the multilayered bottom doped region. The bottom contact includes one or more conductive flanges that fill the cavities.

Embodiments of the invention are directed to semiconductor device. A non-limiting example of the semiconductor device includes a semiconductor fin formed on a substrate. A multilayered bottom doped region having alternating doped layers and doped sacrificial layers is formed on the substrate and adjacent to sidewalls of the semiconductor fin. A conductive gate is formed over a channel region of the semiconductor fin and a bottom spacer is formed between the conductive gate and the multilayered bottom doped region. A bottom contact is formed over the multilayered bottom doped region. The bottom contact includes one or more conductive flanges extending under the bottom spacer.

Embodiments of the present invention are directed to a method for fabricating a semiconductor device. A non-limiting example of the method includes forming a semiconductor fin on a substrate. A multilayered bottom doped region having alternating doped layers and sacrificial layers is formed on the substrate and adjacent to sidewalls of the semiconductor fin. A conductive gate is formed over a channel region of the semiconductor fin and a bottom spacer is formed between the conductive gate and the multilayered bottom doped region. A portion of the semiconductor fin between the bottom spacer and the substrate is doped. One or more cavities are formed by removing portions of the doped sacrificial layers. A bottom contact is formed over the multilayered bottom doped region. The bottom contact includes one or more conductive flanges filling the cavities. The conductive flanges extend from the bottom contact to the doped portion of the semiconductor fin.

Embodiments of the present invention are directed to a method for fabricating a semiconductor device. A non-limiting example of the method includes forming a semiconductor fin on a substrate. A multilayered bottom doped region having alternating doped layers and sacrificial layers is formed on the substrate and adjacent to sidewalls of the semiconductor fin. A conductive gate is formed over a channel region of the semiconductor fin and a bottom spacer is formed between the conductive gate and the multilayered bottom doped region. A portion of the semiconductor fin between the bottom spacer and the substrate is doped. One or more cavities are formed by removing portions of the doped sacrificial layers. A bottom contact having conductive flanges partially extending from the bottom contact to the doped portion of the semiconductor fin is formed over the multilayered bottom doped region.

Embodiments of the invention are directed to semiconductor device. A non-limiting example of the semiconductor device includes a semiconductor fin formed on a substrate. A multilayered bottom doped region having alternating doped layers and doped sacrificial layers is formed on the substrate and adjacent to sidewalls of the semiconductor fin. A bottommost doped sacrificial layer includes a first germanium content and the other doped sacrificial layers include a second germanium content. A conductive gate is formed over a channel region of the semiconductor fin and a bottom spacer is formed between the conductive gate and the multilayered bottom doped region. A bottom contact having one or more differential flanges extending under the bottom spacer is formed over the multilayered bottom doped region. The differential flanges include a first flange having a first length and a second flange having a second length.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
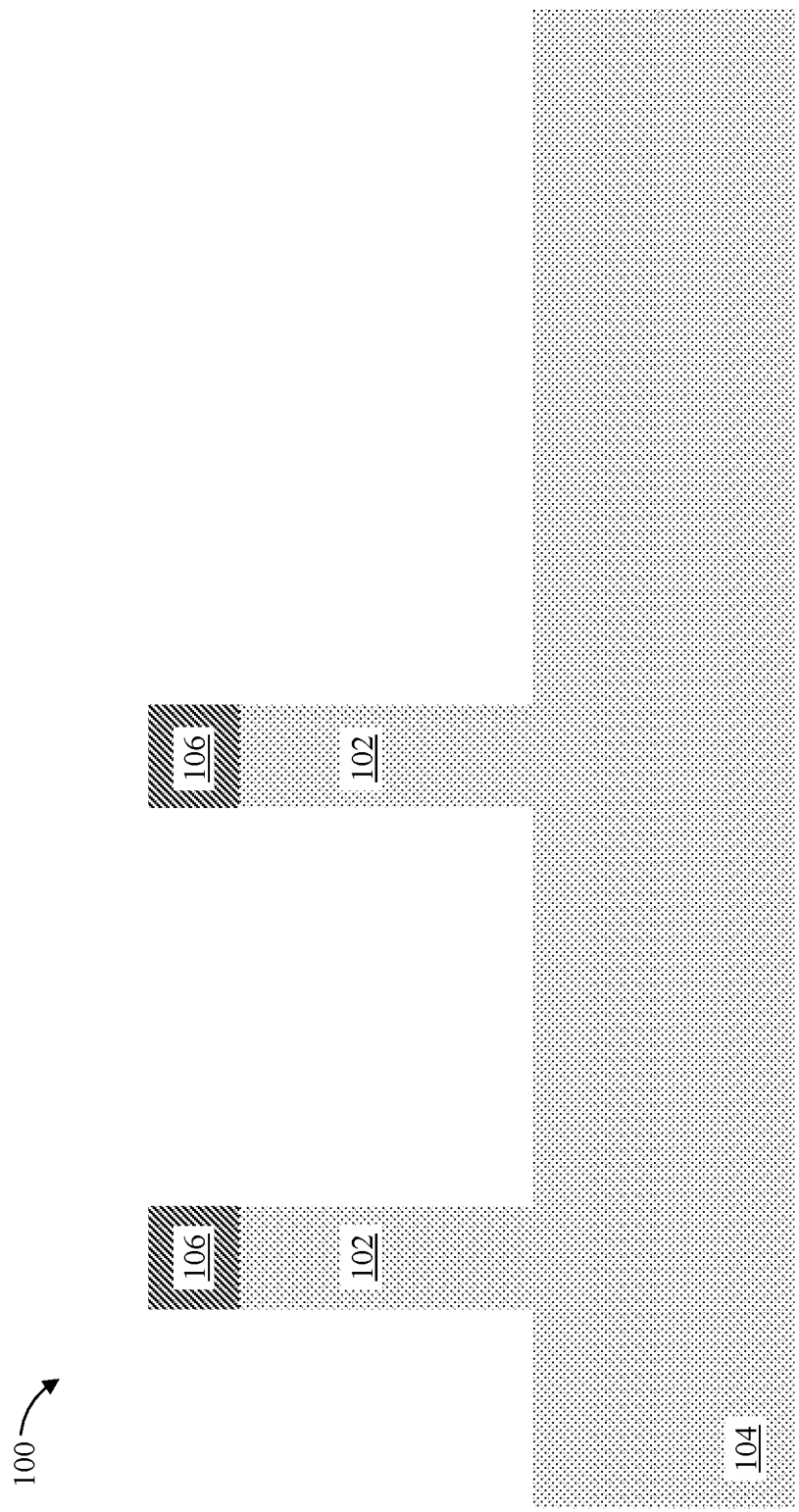
FIG. 1 depicts a cross-sectional view of a semiconductor structure after a processing operation according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. There are challenges, however, in scaling VFETs beyond the 10 nm node. For example, aggressive scaling of the VFET architecture has placed practical constraints on the maximum available width for the bottom source/drain (S/D) contact. Decreasing the width of the bottom S/D contact to satisfy progressively smaller VFET scaling factors has resulted in a gradual increase of the bottom S/D contact resistance, and consequently, to reductions in device performance.

Moreover, in a VFET the contact to the bottom S/D is formed in close proximity to (i.e., adjacent to) the gate. This configuration in combination with the reduced footprint of VFETs results in a large parasitic capacitance between the gate and the bottom S/D contact. Parasitic capacitance between two conductors (also known as conductor-to-conductor capacitance) is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices. Conventional approaches to reducing the parasitic capacitance between the gate and the bottom S/D contact have not been wholly successful. In a conventional VFET, for example, the bottom S/D contact can be formed further from the gate to somewhat mitigate this parasitic capacitance. Doing so, however, represents an area penalty that severely restricts the overall scaling factor of the VFET architecture.

Turning now to an overview of aspects of the present invention, one or more embodiments of the invention provide methods and structures configured to reduce the bottom S/D contact resistance and the bottom S/D contact-to-gate parasitic capacitance in a VFET. A multilayered bottom S/D including alternating doped layers and doped sacrificial layers is formed over a substrate. A bottom spacer, gate stack, top spacer, and top S/D regions are then formed over the multilayered bottom S/D according to conventional VFET processes. Portions of the doped sacrificial layers are selectively removed to form one or more cavities. The cavities are filled with conductive materials while forming the bottom S/D contact. In this manner, a bottom S/D contact having one or more conductive flanges is provided. The flanges serve to lower the contact resistance of the bottom S/D contact by increasing the bottom S/D contact area.

In some embodiments of the present invention, this increased bottom S/D contact area is leveraged to reduce the width of the bottom S/D contact via (hereinafter bottom S/D contact). As mentioned previously, parasitic capacitance is a partial function of the distance separating two conductors. Consequently, decreasing the width of the bottom S/D contact allows for the distance between the gate and the bottom S/D contact to be increased without a corresponding increase in spacing requirements. In this manner, the bottom S/D contact-to-gate parasitic capacitance can be reduced.

Turning now to a more detailed description of aspects of the present invention, FIG. 1 depicts a cross-sectional view of a structure 100 having vertical semiconductor fins 102 formed on a substrate 104 during an intermediate operation of a method of fabricating a semiconductor device according to one or more embodiments of the invention. The vertical semiconductor fins 102 (hereinafter fins 102) can be formed on the substrate 104 using known front-end-of-line (FEOL) VFET fabrication techniques. For example, in some embodiments of the invention, a hard mask 106 is patterned to expose portions of the substrate 104. The exposed portions of the substrate 104 can then be removed to form a plurality of vertical semiconductor fins using an etch process, which can be a wet etch process, a dry etch process or a combination thereof. Each of the fins 102 can have a height ranging from 1 nm to 150 nm. Each of the fins 102 can have a width ranging from 5 nm to 40 nm. Adjacent fins 102 can be separated by a pitch ranging from 10 nm to 100 nm.

The substrate 104 can be any suitable substrate material, such as, for example, monocrystalline Si, SiGe, SiC, III-V compound semiconductor, II-VI compound semiconductor, or semiconductor-on-insulator (SOI). In some embodiments, the substrate 104 includes a buried oxide layer (not depicted). The fins 102 can be electrically isolated from other regions of the substrate 104 by a shallow trench isolation (not depicted). The shallow trench isolation can be of any suitable dielectric material, such as, for example, a silicon oxide.

Figure 2:
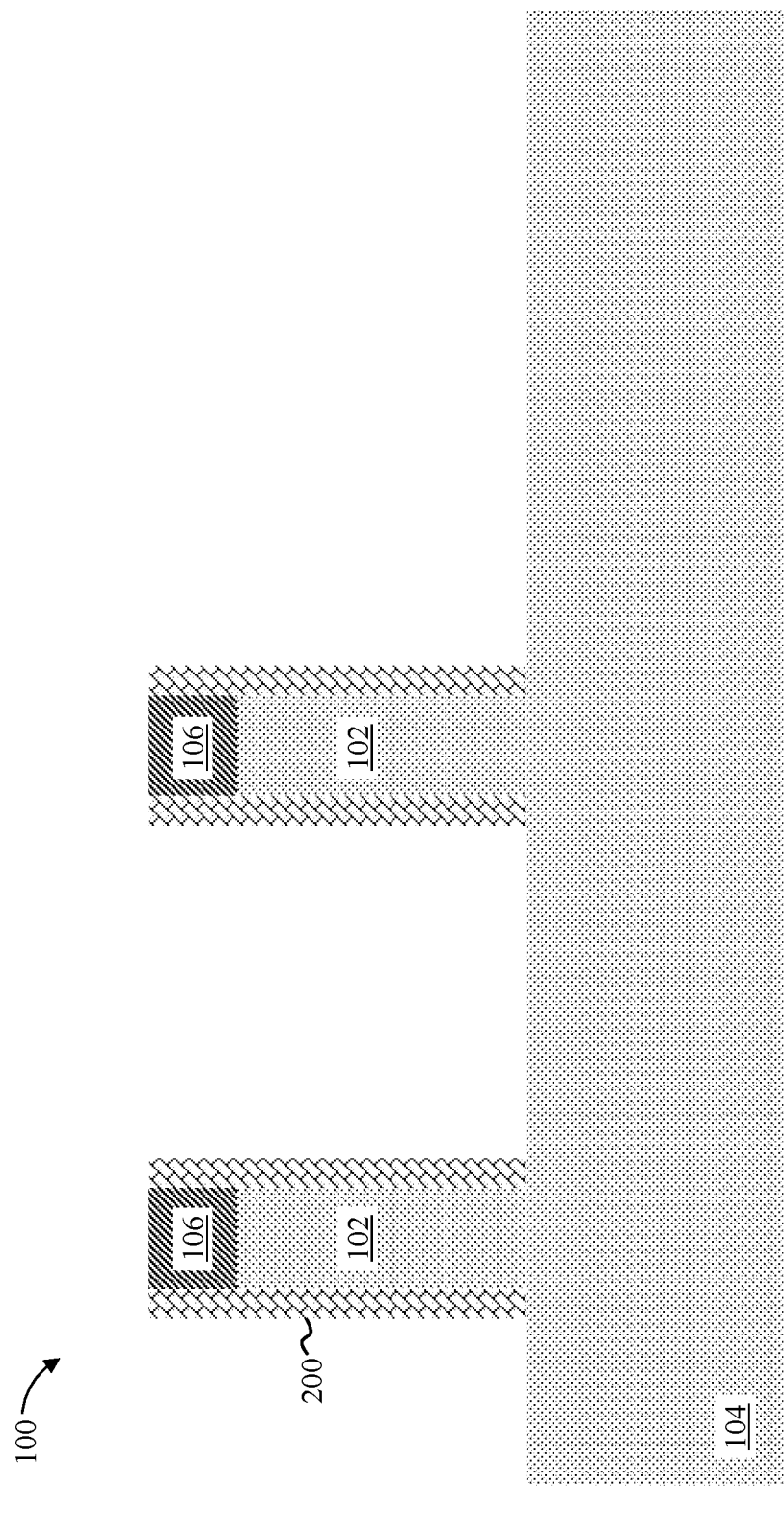
FIG. 2 depicts a cross-sectional view of the semiconductor structure after a processing operation according to one or more embodiments of the present invention.

FIG. 2 depicts a cross-sectional view of the structure 100 after forming spacers 200 on sidewalls of the fins 102 during an intermediate operation of a method of fabricating a semiconductor device according to one or more embodiments of the invention. The spacers 200 can be a dielectric material, such as a silicon nitride or a low-k material, or a combination thereof. The low-k material can be a dielectric material having a dielectric constant less than about 7, less than about 5, or even less than about 2.5, such as, for example, silicon carbides (SiC), silicon oxycarbides (SiOC), silicon carbon nitrides (SiCN), boron nitrides (BN), silicon boron nitrides (SiBN), silicon boron carbide nitrides (SiBCN), silicon oxycarbonitrides (SiOCN), silicon oxynitrides ($SiO_xN_y$), or combinations thereof. The spacers 200 can be formed using known processes. In some embodiments of the present invention, the spacers 200 are conformally formed using a CVD, PECVD, ALD, PVD, chemical solution deposition, or other like process in combination with a wet or dry etch process.

Figure 3:
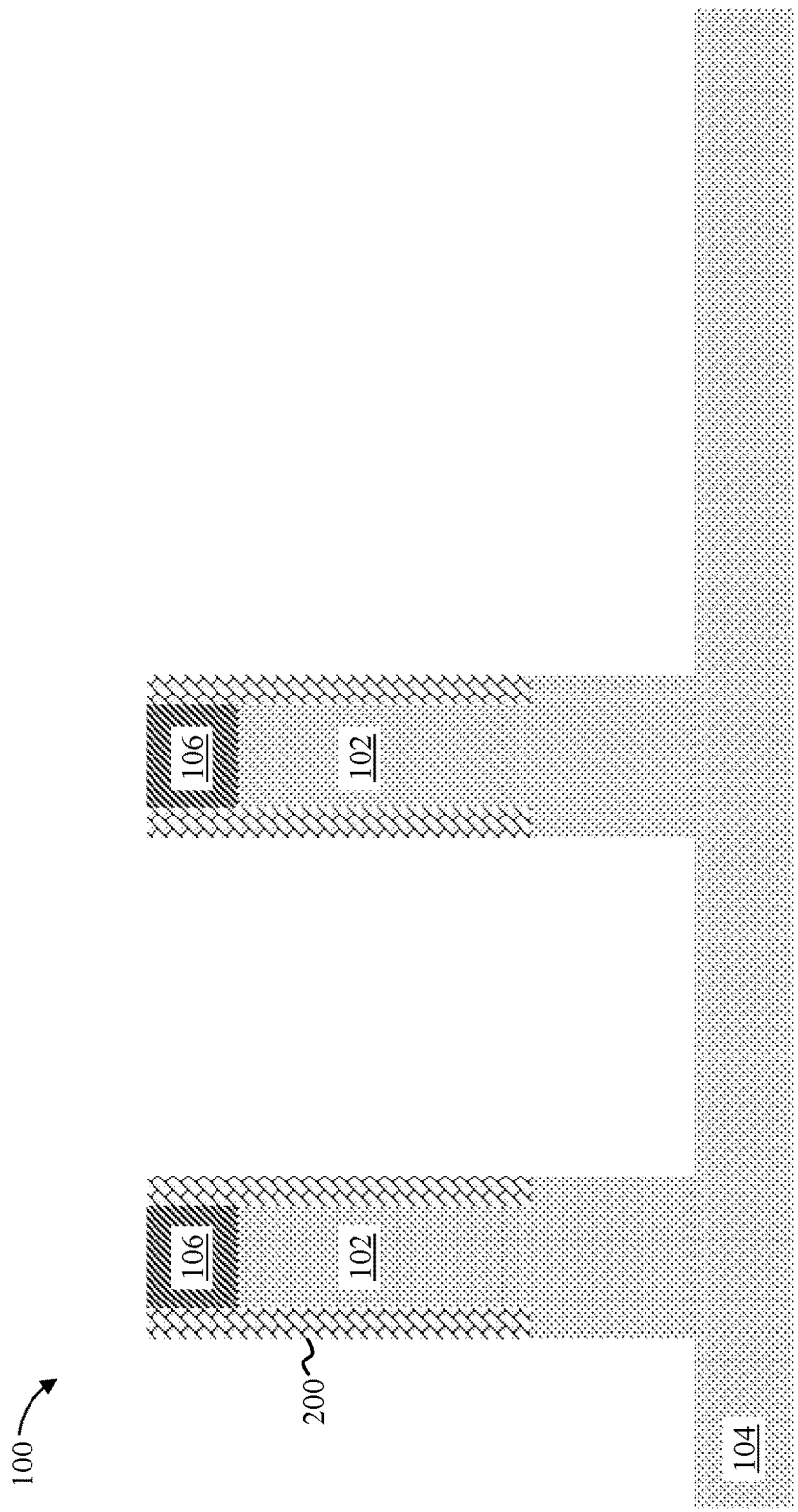
FIG. 3 depicts a cross-sectional view of the semiconductor structure after a processing operation according to one or more embodiments of the present invention.

FIG. 3 depicts a cross-sectional view of the structure 100 after recessing a top surface of the substrate 104 during an intermediate operation of a method of fabricating a semiconductor device according to one or more embodiments of the invention. The top surface of the substrate 104 can be recessed using, for example, a wet etch, a dry etch, or a combination thereof. In some embodiments of the present invention, the top surface of the substrate 104 is recessed selective to the spacers 200.

Figure 4:
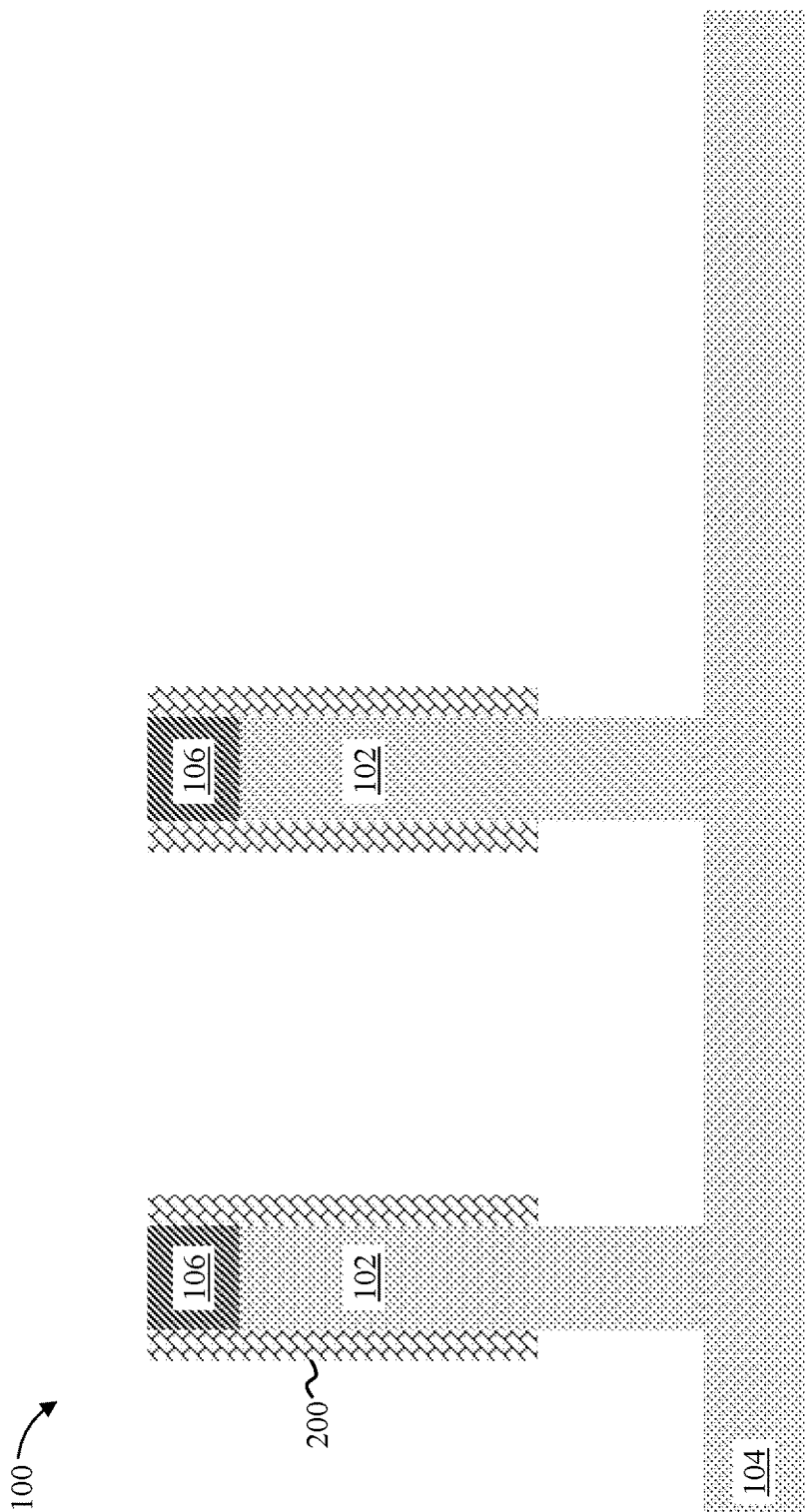
FIG. 4 depicts a cross-sectional view of the semiconductor structure after a processing operation according to one or more embodiments of the present invention.

FIG. 4 depicts a cross-sectional view of the structure 100 after laterally recessing portions of the substrate 104 under the spacers 200 during an intermediate operation of a method of fabricating a semiconductor device according to one or more embodiments of the invention. Portions of the substrate 104 can be laterally recessed using known processes, such as, for example, a directional ME. In some embodiments of the present invention, portions of the substrate 104 are laterally etched selective to the spacers 200.

Figure 5:
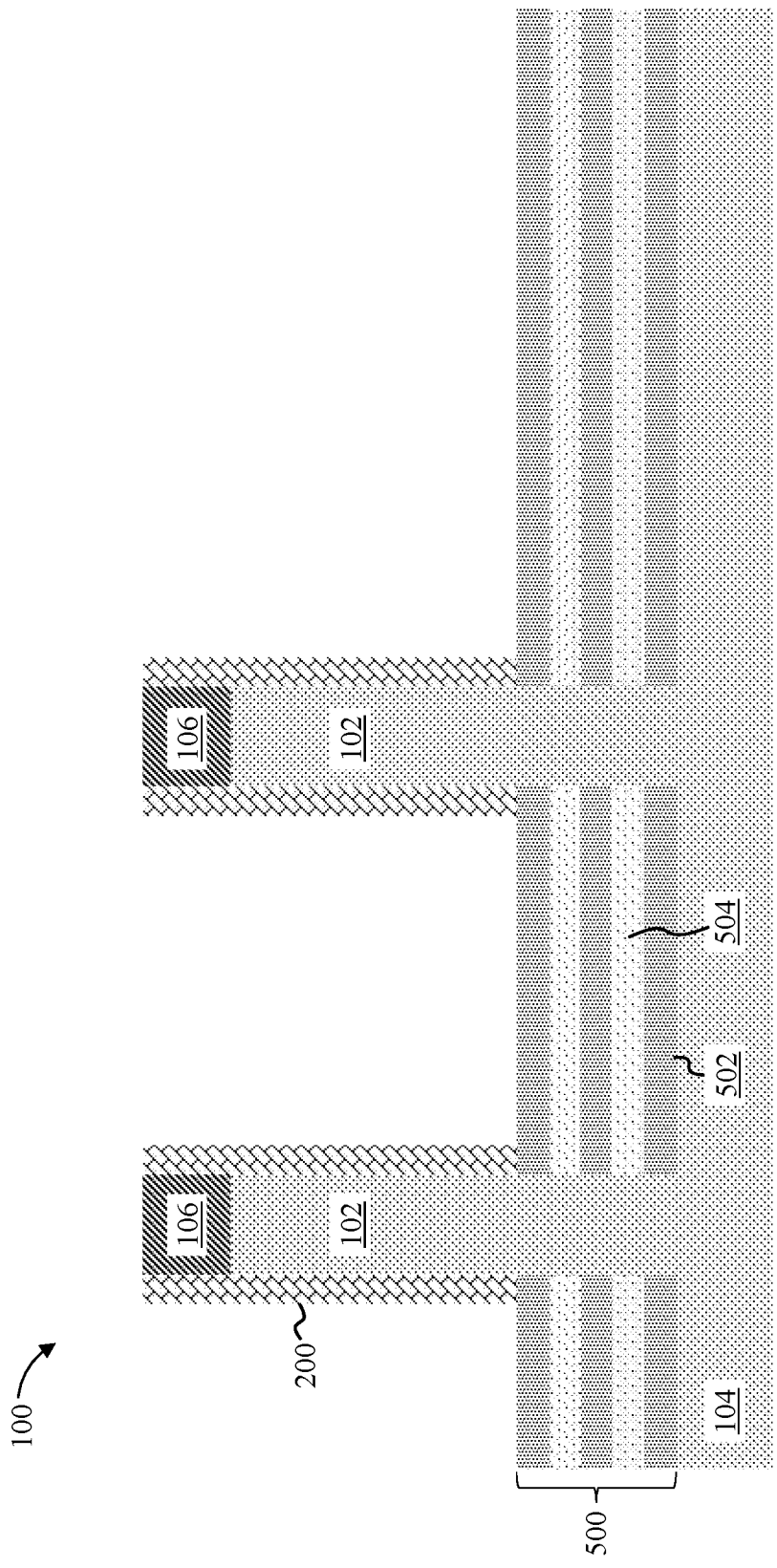
FIG. 5 depicts a cross-sectional view of the semiconductor structure after a processing operation according to one or more embodiments of the present invention.

FIG. 5 depicts a cross-sectional view of the structure 100 after forming a multilayered bottom S/D 500 (also referred to as a multilayered bottom doped region) during an intermediate operation of a method of fabricating a semiconductor device according to one or more embodiments of the invention. The multilayered bottom S/D 500 includes doped layers 502 alternating with doped sacrificial layers 504. The multilayered bottom S/D 500 can be a source or drain region formed on the substrate 104 by a variety of methods. In some embodiments of the present invention, the doped layers 502 and sacrificial layers 504 are formed by selective epitaxial growth over the substrate 104. The doped layers 502 and doped sacrificial layers 504 can include epitaxial semiconductor materials grown from gaseous or liquid precursors. For example, epitaxial semiconductor materials can be grown using vapor-phase epitaxy (VPE), molecular-beam epitaxy (MBE), liquid-phase epitaxy (LPE), chemical-vapor-deposition (CVD), or other suitable processes.

In some embodiments of the present invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Epitaxial silicon, silicon germanium (SiGe), and/or carbon doped silicon (Si:C) can be doped during deposition (in-situ doped) or doped following the epitaxy by adding n-type dopants (e.g., As, P, Sb) or p-type dopants (e.g., Ga, B, Al), depending on the type of transistor (i.e., n-type dopants for an nFET and p-type dopants for a pFET). The dopant concentration in the doped layers 502 can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

Depending on the type of transistor, the doped layers 502 and sacrificial layers 504 can be formed using doped Si, SiGe, or Ge. For example, in an nFET the doped layers 502 can be doped Si layers (e.g., Si:P, Si:As) and the sacrificial layers 504 can be doped SiGe or Ge layers (e.g., SiGe:P, Ge:P, SiGe:As, Ge:As). In a pFET the doped layers 502 can be doped SiGe layers (e.g., SiGe:B, SiGe:Ga) and the sacrificial layers 504 can be doped Si layers (Si:B, Si:Ga) or doped SiGe layers having a higher Ge content than the doped layers 502 (e.g., SiGe:B, Ge:B, SiGe:Ga, GeGa).

Figure 6:
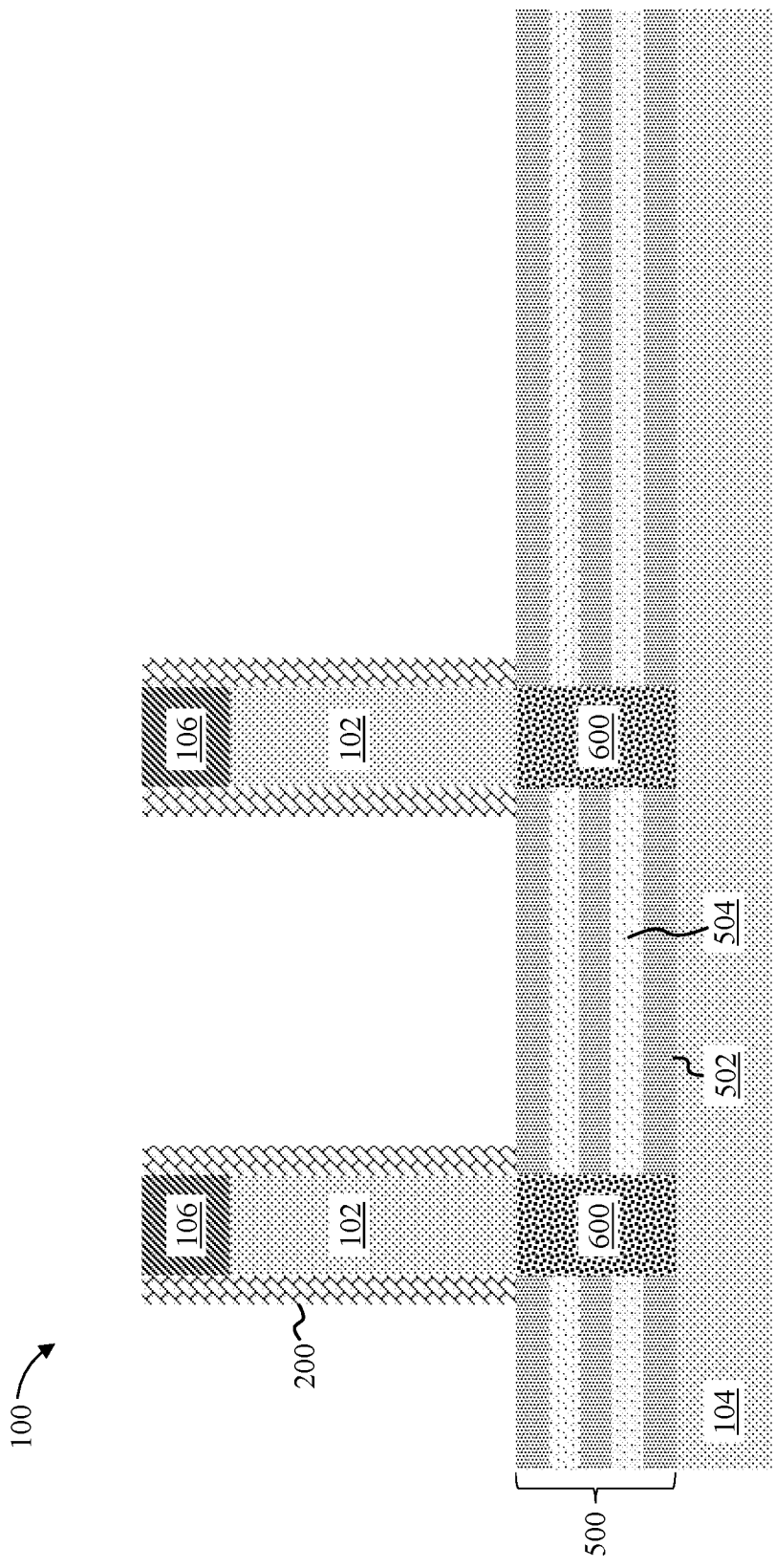
FIG. 6 depicts a cross-sectional view of the semiconductor structure after a processing operation according to one or more embodiments of the present invention.

FIG. 6 depicts a cross-sectional view of the structure 100 after forming a bottom extension 600 during an intermediate operation of a method of fabricating a semiconductor device according to one or more embodiments of the invention. The bottom extension 600 can be formed using known VFET processes, such as, for example, drive-in annealing.

Figure 7:
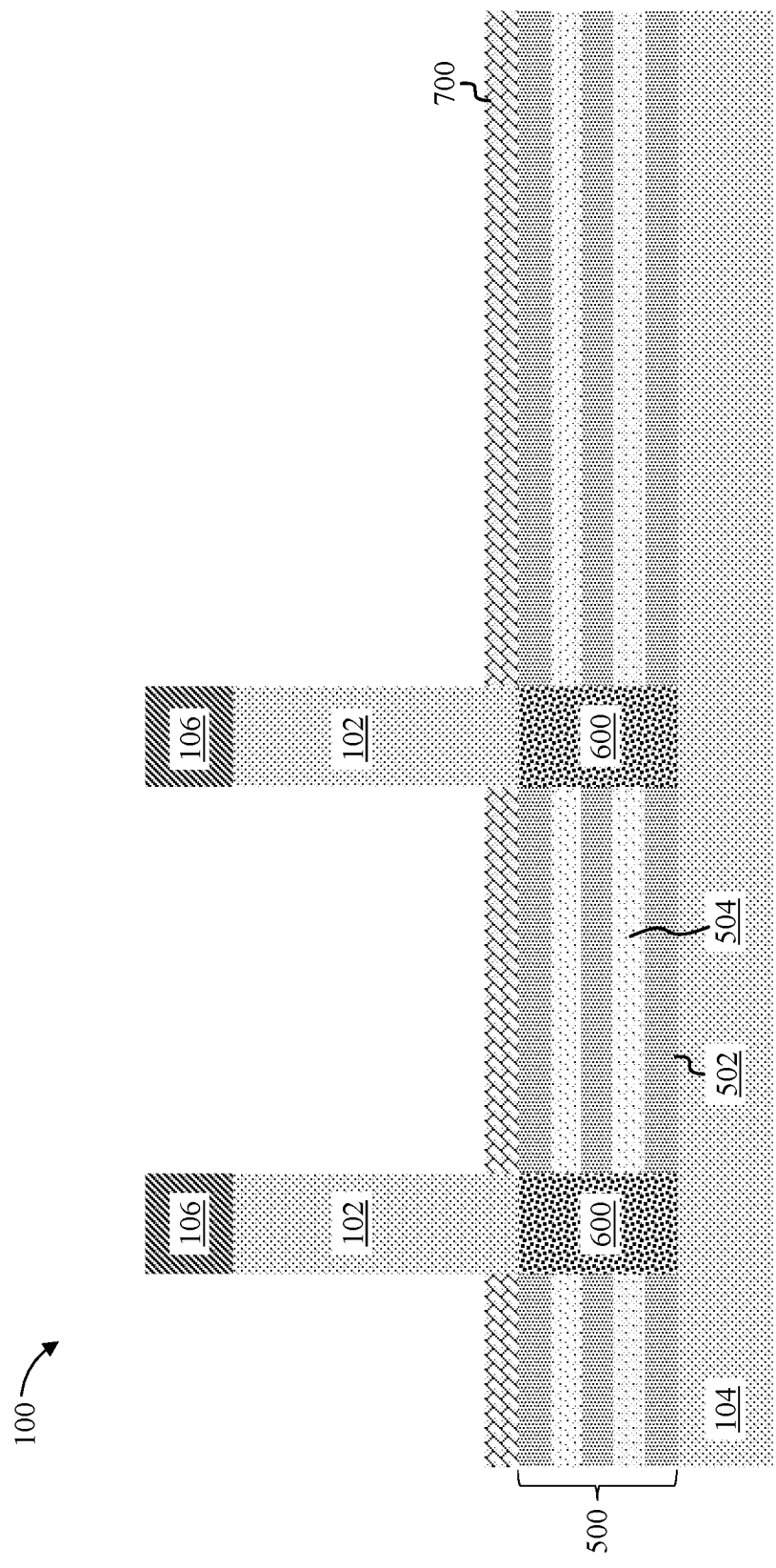
FIG. 7 depicts a cross-sectional view of the semiconductor structure after a processing operation according to one or more embodiments of the present invention.

FIG. 7 depicts a cross-sectional view of the structure 100 after removing the spacers 200 and forming a bottom spacer 700 over the multilayered bottom S/D 500 during an intermediate operation of a method of fabricating a semiconductor device according to one or more embodiments of the invention. The spacers 200 can be removed using known processes, such as, for example, a wet etch, a dry etch, or a combination thereof. In some embodiments of the present invention, the spacers 200 are removing using RIE selective to the hard mask 106.

The bottom spacer 700 can include a dielectric material, such as, for example, SiO2, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The bottom spacer 700 can be formed using known deposition processes, such as, for example, CVD, PECVD, ALD, PVD, chemical solution deposition, or other like processes. In some embodiments of the present invention, the bottom spacer 700 is formed by performing a directional deposition process such as, for example, a Gas Cluster Ion Beam (GCIB) and a high-density plasma CVD (HDP-CVD) process. The GCIB process is a deposition process that can be highly directional in nature. For example, the directional deposition process can result in the deposition of dielectric material on the horizontally oriented surfaces of the device, such as a surface of the multilayered bottom S/D 500, while avoiding deposition of any substantial amount of dielectric material on the vertically-oriented surfaces of the device, such as sidewalls of the fins 102.

Figure 8:
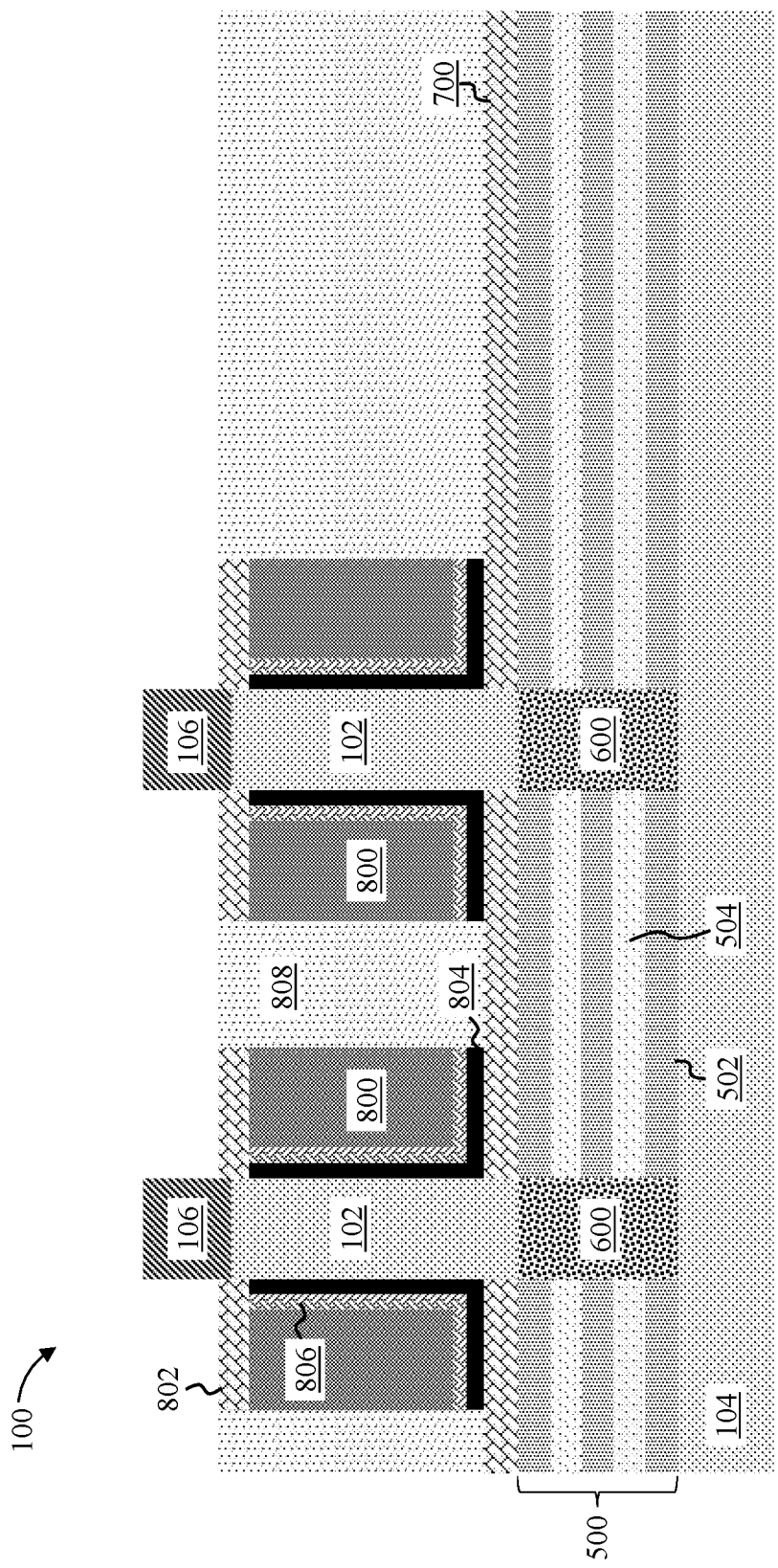
FIG. 8 depicts a cross-sectional view of the semiconductor structure after a processing operation according to one or more embodiments of the present invention.

FIG. 8 depicts a cross-sectional view of the structure 100 after forming conductive gates 800 and top spacers 802 during an intermediate operation of a method of fabricating a semiconductor device according to one or more embodiments of the invention. The conductive gates 800 are formed over channel regions of the fins 102 using known VFET processes. In some embodiments of the present invention, the conductive gates 800 are overfilled above a surface of the fins 102 and then recessed below a surface of the semiconductor fins 102 using, for example, a wet or dry etch.

The conductive gates 800 can be high-k metal gates (HKMG) and can include, for example, one or more high-k dielectric films 804 and one or more work function metals (WFM) 806. The one or more high-k dielectric films 804 can be a dielectric material having a dielectric constant greater than, for example, 3.9, 7.0, or 10.0. Non-limiting examples of suitable materials for the high-k dielectric films 804 include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric films 804 can further include dopants such as, for example, lanthanum and aluminum. The high-k dielectric films 804 can be formed by suitable deposition processes, for example, CVD, PECVD, atomic layer deposition (ALD), evaporation, physical vapor deposition (PVD), chemical solution deposition, or other like processes. The thickness of the high-k dielectric films 804 can vary depending on the deposition process as well as the composition and number of high-k dielectric materials used. The high-k dielectric films 804 can have a thickness in a range from about 0.5 to about 20 nm.

The WFM 806 can be disposed over the high-k dielectric films 804. The type of work function metal depends on the type of transistor and can differ between the nFET and pFET devices. P-type work function metals include compositions such as ruthenium, palladium, platinum, cobalt, nickel, and conductive metal oxides, or any combination thereof. N-type work function metals include compositions such as hafnium, zirconium, titanium, tantalum, aluminum, metal carbides (e.g., hafnium carbide, zirconium carbide, titanium carbide, and aluminum carbide), aluminides, or any combination thereof. The WFM 806 can be deposited by a suitable deposition process, for example, CVD, PECVD, PVD, plating, thermal or e-beam evaporation, and sputtering.

The bulk material (gate conductor material) for the conductive gates 800 can be deposited over the high-k dielectric films 804 and WFM 806 to form a HKMG. Non-limiting examples of suitable conductive materials include aluminum (Al), platinum (Pt), gold (Au), tungsten (W), titanium (Ti), or any combination thereof. The gate conductor material can be deposited by a suitable deposition process, for example, CVD, PECVD, PVD, plating, thermal or e-beam evaporation, and sputtering.

An interlayer dielectric (ILD) 808 is formed over the bottom spacer 700 and between adjacent conductive gates 800. The ILD 808 can be any suitable dielectric material, such as, for example, a silicon oxide, and can be formed using any suitable process. In some embodiments of the present invention, the ILD 808 is planarized to a surface of the top spacers 802 using, for example, CMP.

Figure 9:
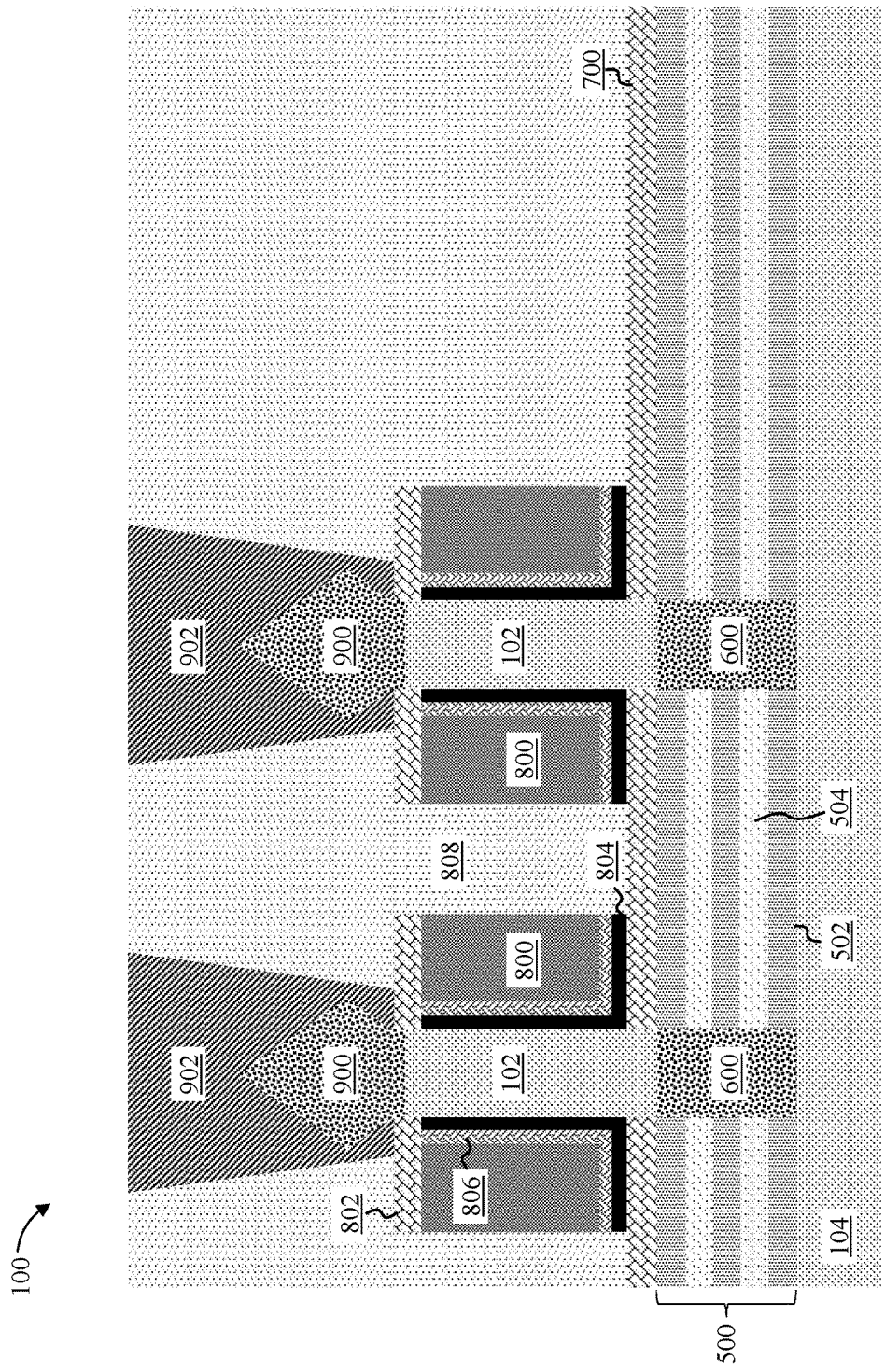
FIG. 9 depicts a cross-sectional view of the semiconductor structure after a processing operation according to one or more embodiments of the present invention.

FIG. 9 depicts a cross-sectional view of the structure 100 after removing the hard mask 106 and forming top S/D regions 900 and top S/D contacts 902 during an intermediate operation of a method of fabricating a semiconductor device according to one or more embodiments of the invention. The hard mask 106 can be removed using, for example, a wet etch, a dry etch, or a combination thereof. In some embodiments of the present invention, the top S/D regions 900 are epitaxially grown on a surface of the fins 102 after removing the hard mask 106.

The top S/D regions 900 can be epitaxially grown in a similar manner as the multilayered bottom S/D 500. For example, epitaxial materials can be grown from gaseous or liquid precursors using CVD, VPE, MBE, or LPE. The top S/D regions 900 can be doped during deposition (in-situ doped) by adding dopants, n-type dopants (e.g., phosphorus or arsenic) or p-type dopants (e.g., boron or gallium), depending on the type of transistor. The dopant concentration in the top S/D region 900 can range from about $1\times10^{19}$ cm$^{-3}$ to about $2\times10^{21}$ cm$^{-3}$, for example, between about $2\times10^{20}$ cm$^{-3}$ to about $1\times10^{21}$ cm$^{-3}$.

The top S/D contacts 902 are formed in ohmic contact with the top S/D regions 900 using known metallization techniques. For example, in some embodiments of the present invention, the ILD 808 is extended and then patterned with open trenches (not depicted). The top S/D contacts 902 are then deposited into the trenches. In some embodiments of the present invention, the top S/D contacts 902 are overfilled into the trenches, forming overburdens above a surface of the ILD 808. CMP can be used to remove the overburden.

The top S/D contacts 902 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive material can further include dopants that are incorporated during or after deposition. In some embodiments of the present invention, the top S/D contacts 902 can be copper or tungsten and can include a barrier metal liner (not depicted). The barrier metal liner prevents the copper or tungsten from diffusing into, or doping, the surrounding materials, which can degrade their properties. Silicon, for example, forms deep-level traps when doped with copper. An ideal barrier metal liner must limit the bulk metal diffusivity sufficiently to chemically isolate the conductor from the surrounding materials and should have a high electrical conductivity, for example, tantalum, tantalum nitride, titanium, titanium nitride, cobalt, ruthenium, manganese, or titanium carbide.

In some embodiments of the present invention, the top S/D contacts 902 include a metal (e.g., titanium) that reacts with semiconductor materials (e.g., the top S/D regions 900) to form a silicide film (not depicted) between the top S/D regions 900 and the top S/D contacts 902. As the silicide film is only formed at the interface between the top S/D contacts 902 and the top S/D regions 900 the silicide film can be said to be self-aligned to the top S/D regions 900 (a self-aligned silicide is also referred to as a salicide).

Figure 10:
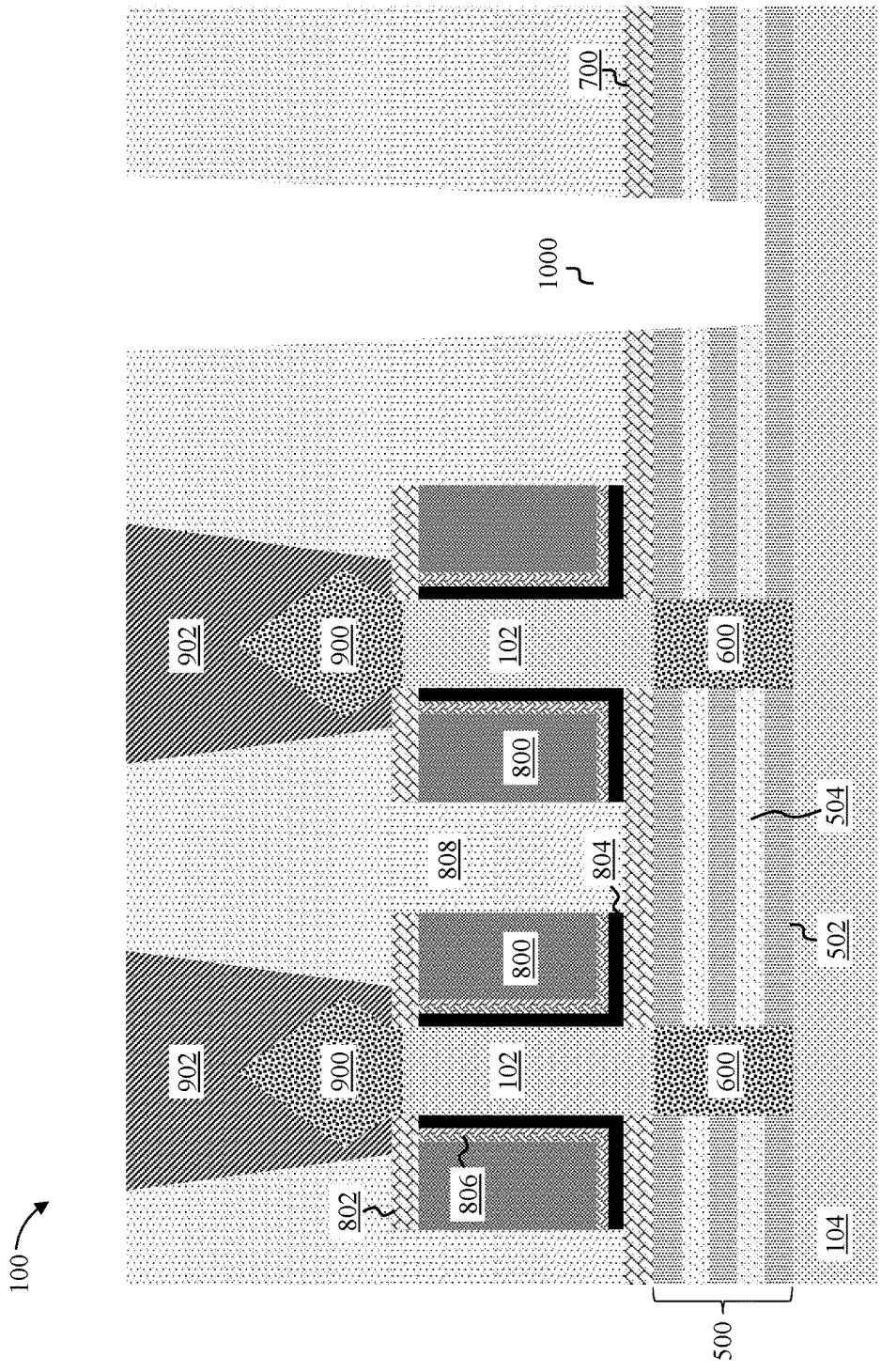
FIG. 10 depicts a cross-sectional view of the semiconductor structure after a processing operation according to one or more embodiments of the present invention.

FIG. 10 depicts a cross-sectional view of the structure 100 after forming a bottom S/D trench 1000 during an intermediate operation of a method of fabricating a semiconductor device according to one or more embodiments of the invention. The bottom S/D trench 1000 can be formed by removing portions of the ILD 808 using, for example, a wet etch, a dry etch, or a combination thereof. In some embodiments of the present invention, the bottom S/D trench 1000 is formed using ME. In some embodiments of the present invention, the bottom S/D trench 1000 includes a width of about 10 nm to about 50 nm, although other widths are within the contemplated scope of the invention.

In some embodiments of the present invention, the bottommost doped sacrificial layer of the doped sacrificial layers 504 is formed having a higher germanium content than the germanium content of the remaining doped sacrificial layers 504. Consequently, the bottommost doped sacrificial layer can be etched at an etch rate that is higher than an etch rate of the remaining doped sacrificial layers 504 when exposed to a etchant. The etch rate differential can be leveraged with a timed ME to form the bottom S/D trench 1000 selective to the bottommost doped layer 502.

Figure 11:
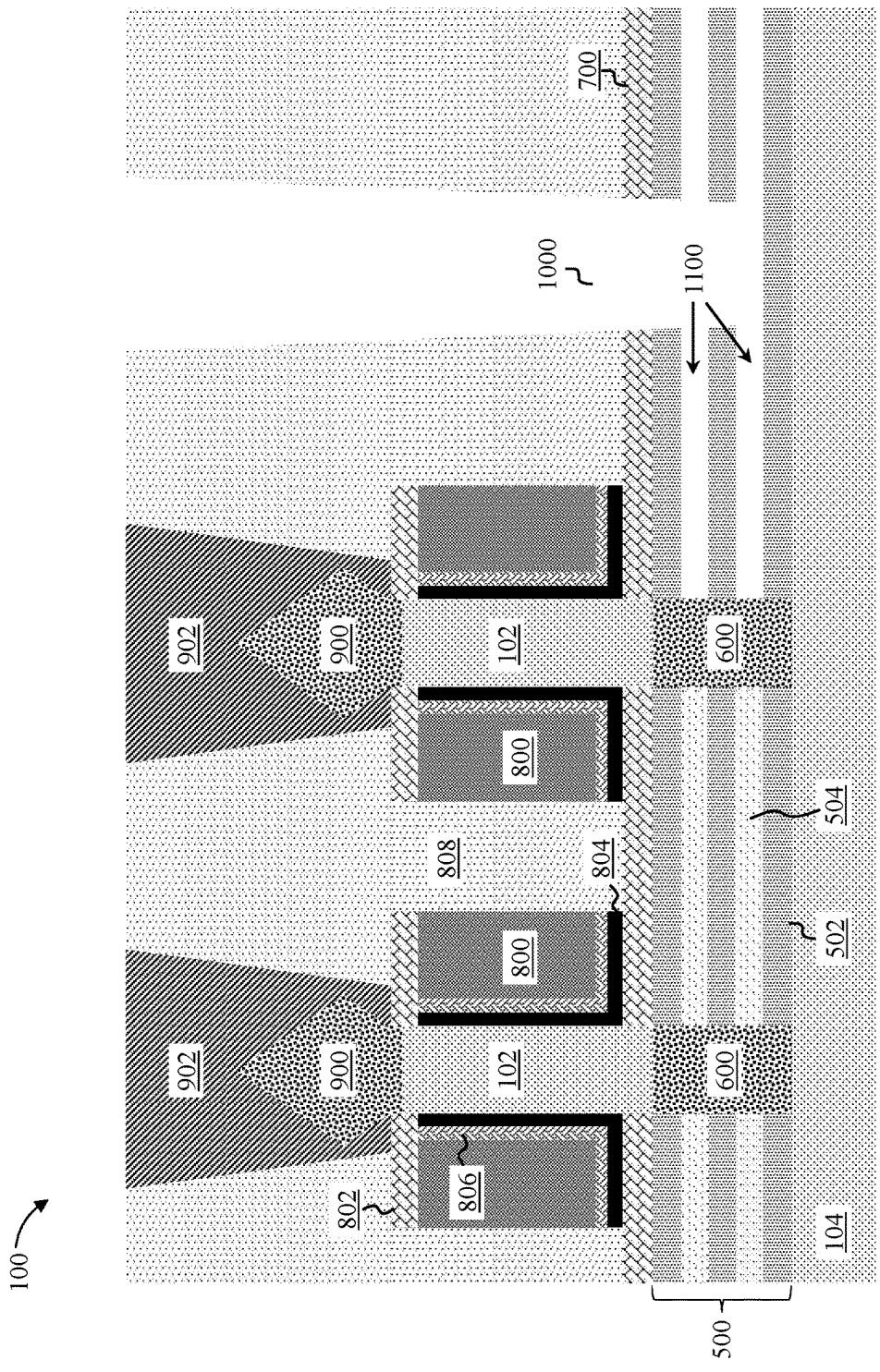
FIG. 11 depicts a cross-sectional view of the semiconductor structure after a processing operation according to one or more embodiments of the present invention.

FIG. 11 depicts a cross-sectional view of the structure 100 after removing portions of the sacrificial layers 504 to form cavities 1100 under the bottom spacer 700 during an intermediate operation of a method of fabricating a semiconductor device according to one or more embodiments of the invention. The cavities 1100 can be formed using, for example, a lateral etch. As discussed previously herein, the doped sacrificial layers 504 can include SiGe having a high Ge content. The Ge content of the doped sacrificial layers 504 allows for the doped sacrificial layers 504 to be etched selective to the doped layers 502. For example, in an nFET SiGe can be removed selective to silicon by exposure to gas phase hydrochloride (HCl) or by a wet etch containing hydrogen peroxide ($H_2O_2$), SC1, etc. In a pFET the SiGe layers having the highest Ge content (i.e., the doped sacrificial layers 504) are etched at the fastest etch rate. This etch rate can be further increased by increasing the Ge content of the doped sacrificial layers 504. In some embodiments of the present invention, the doped sacrificial layers 504 are etched until a sidewall of the bottom extension 600 is exposed. In this manner, contact flanges 1202 (conductive flanges) extending to the bottom extension 600 can be formed under the bottom spacer 700 (as depicted in FIG. 12).

Figure 12:
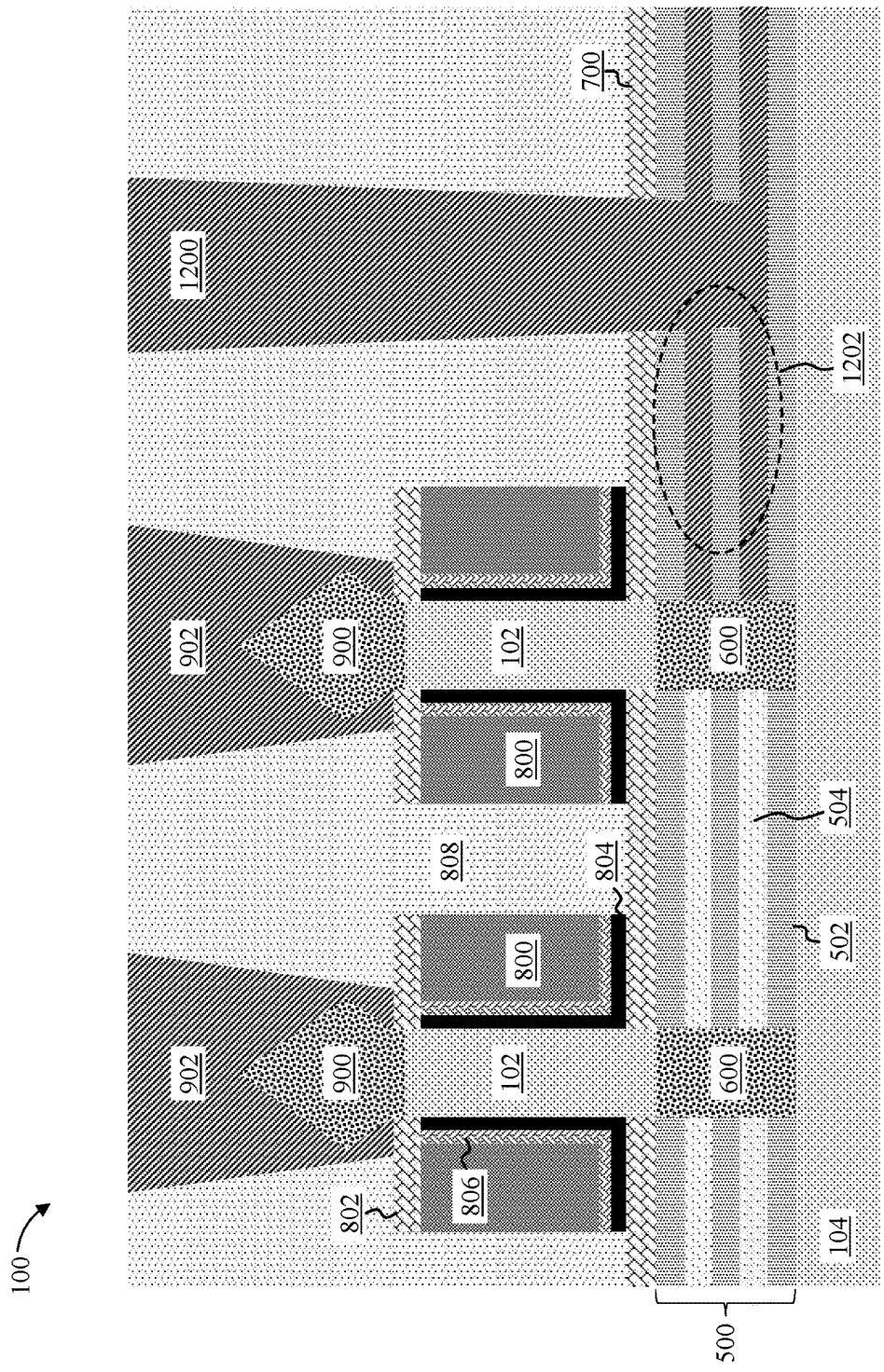
FIG. 12 depicts a cross-sectional view of a semiconductor structure after a processing operation according to one or more embodiments of the present invention.

FIG. 12 depicts a cross-sectional view of the structure 100 after forming a bottom S/D contact 1200 in the bottom S/D trench 1000 during an intermediate operation of a method of fabricating a semiconductor device according to one or more embodiments of the invention. The bottom S/D contact 1200 can be formed in a like manner and composition as the top S/D contacts 902. As discussed previously herein, portions of the bottom S/D contact 1200 fill the cavities 1100 to form contact flanges 1202 below a surface of the bottom spacer 700. The contact flanges 1202 increase the contact area of the bottom S/D contact 1200, and consequently, lower the contact resistance of the bottom S/D contact 1200.

In some embodiments of the present invention, the bottom S/D contact 1200 includes a bulk conductive material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. In some embodiments of the present invention, the bottom S/D contact 1200 includes a metal liner (e.g., Ti, TiN, TiAlC, Ti, Co) that reacts with semiconductor materials (e.g., the doped layers 502) to form a silicide film (not depicted).

Figure 13:
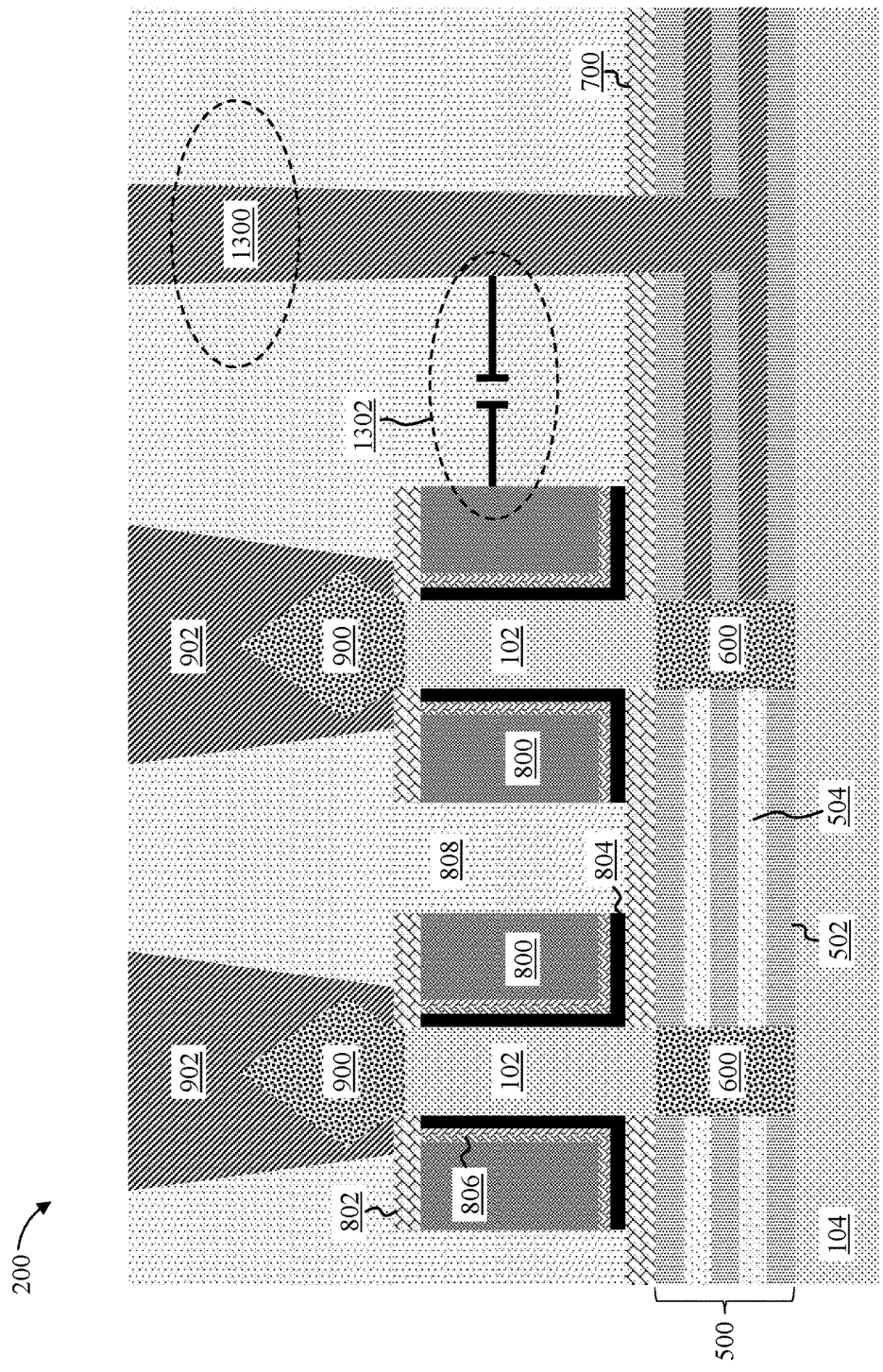
FIG. 13 depicts a cross-sectional view of the semiconductor structure after a processing operation according to one or more embodiments of the present invention.

FIG. 13 depicts a cross-sectional view of a structure 200 after forming a thin bottom S/D contact 1300 in the bottom S/D trench 1000 during an intermediate operation of a method of fabricating a semiconductor device according to one or more embodiments of the invention. As discussed previously herein, the contact flanges 1202 lower the contact resistance of the bottom S/D contact 1200 (as depicted in FIG. 12). In some embodiments of the present invention, this increased contact resistance is leveraged to reduce the width of the bottom S/D contact 1200. FIG. 13 depicts an alternative to the embodiment depicted in FIG. 12 having a thin bottom S/D contact 1300. In some embodiments of the present invention, the thin bottom S/D contact 1300 includes a width of about 5 nm to about 20 nm, although other widths are within the contemplated scope of the invention.

As mentioned previously, parasitic capacitance is a partial function of the distance separating two conductors. Consequently, decreasing the width of the thin bottom S/D contact 1300 allows for the distance between the conductive gates 800 and the thin bottom S/D contact 1300 to be increased without a corresponding increase in spacing requirements. In this manner, the bottom S/D contact-to-gate parasitic capacitance 1302 can be reduced.

Figure 14:
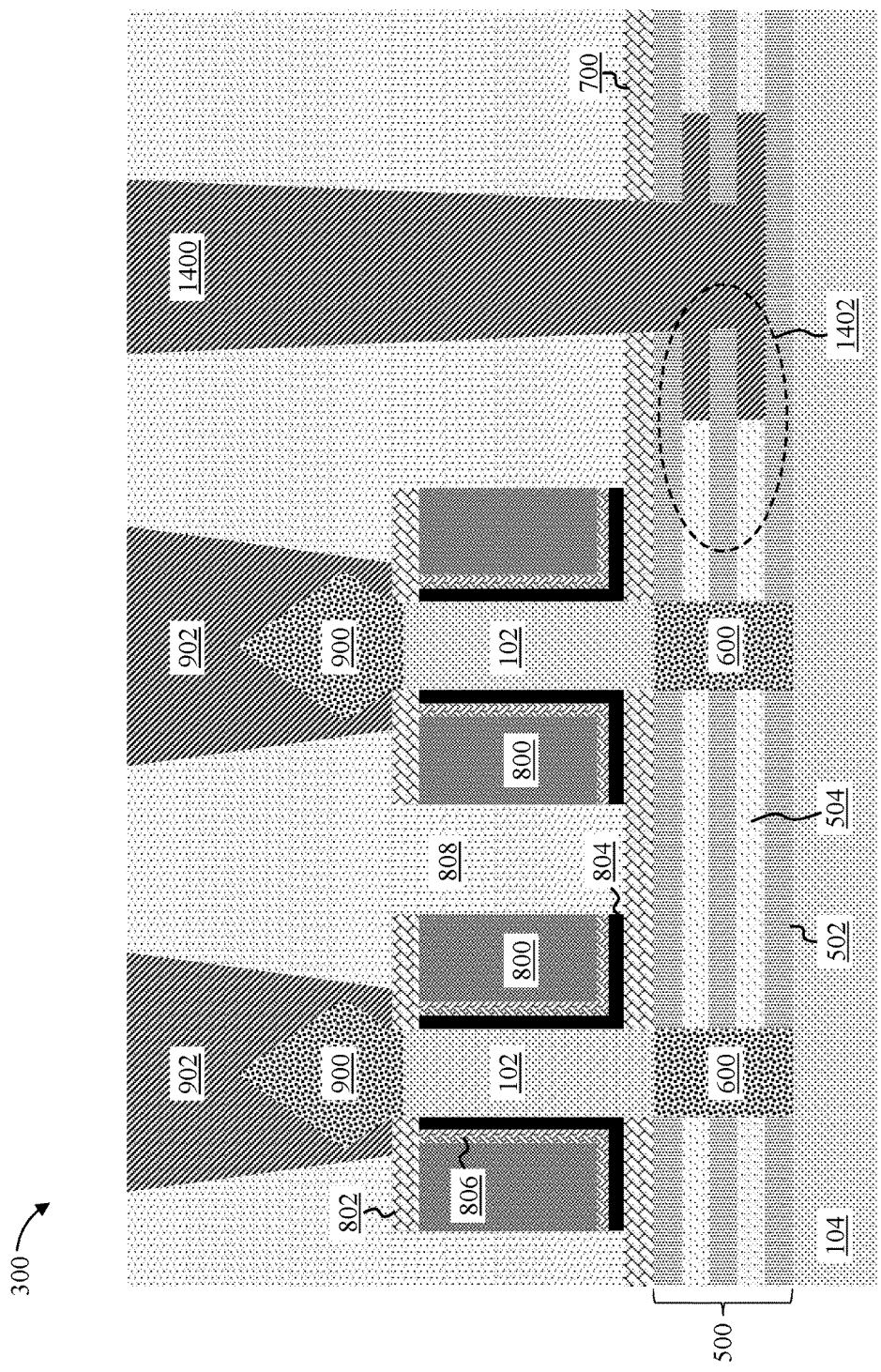
FIG. 14 depicts a cross-sectional view of the semiconductor structure after a processing operation according to one or more embodiments of the present invention.

FIG. 14 depicts a cross-sectional view of a structure 300 after forming a bottom S/D contact 1400 having partial flanges 1402 during an intermediate operation of a method of fabricating a semiconductor device according to one or more embodiments of the invention. As discussed previously herein, the sacrificial layers 504 can be laterally etched selective to the doped layers 502. In some embodiments of the present invention, the sacrificial layers 504 are only partially etched (i.e., a sidewall of the bottom extension 600 is not exposed). A bottom S/D contact 1400 having partial flanges 1402 can be used in embodiments having high aspect ratio cavities 1100 (i.e., a thickness of the sacrificial layers 504 is much less than a width of the cavities 1100) to increase the mechanical stability of the structure 300 and to prevent pinch off. While only a single alternative embodiment depicting a bottom S/D contact 1400 having partial flanges 1402 is depicted, it is understood that the lateral etch of the sacrificial layers 504 can be timed to adjacent the width of the cavities 1100, and consequently, the partial flanges 1402. For example, the partial flanges 1402 can extend 5%, 10%, 15%, 20%, 50%, 75%, 90%, or 100% of the total lateral distance between the bottom S/D contact 1400 and the bottom extension 600.

Figure 15:
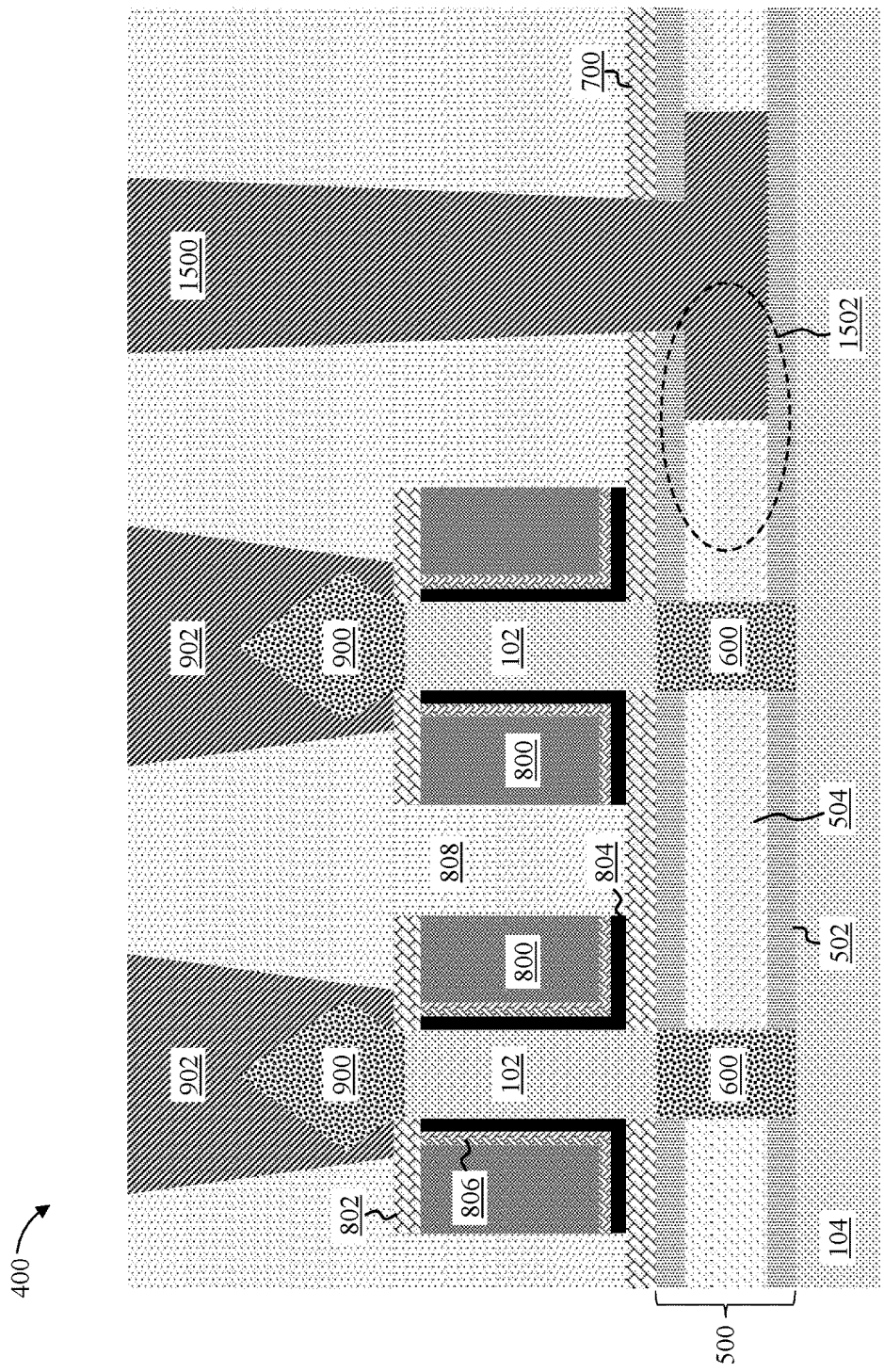
FIG. 15 depicts a cross-sectional view of the semiconductor structure after a processing operation according to one or more embodiments of the present invention.

FIG. 15 depicts a cross-sectional view of a structure 400 after forming a bottom S/D contact 1500 having thick flanges 1502 during an intermediate operation of a method of fabricating a semiconductor device according to one or more embodiments of the invention. As discussed previously herein, the doped sacrificial layers 504 can be laterally etched selective to the doped layers 502. In some embodiments of the present invention, a thickness of the doped sacrificial layers 504 between adjacent doped layers 502 is increased. For example, the thickness of the doped sacrificial layers 504 can be more than 1.5, 2, 3, 4, or 5 times a thickness of each of the doped layers 502, although other thicknesses are within the contemplated scope of the invention. In this manner, a thickness of the flanges 1402 (as depicted in FIG. 14) can be increased. A bottom S/D contact 1500 having thick flanges 1502 can used in embodiments having high aspect ratio cavities 1100 (i.e., a thickness of the sacrificial layers 504 is much less than a width of the cavities 1100) to increase the mechanical stability of the structure 400 and to prevent pinch off.

Figure 16:
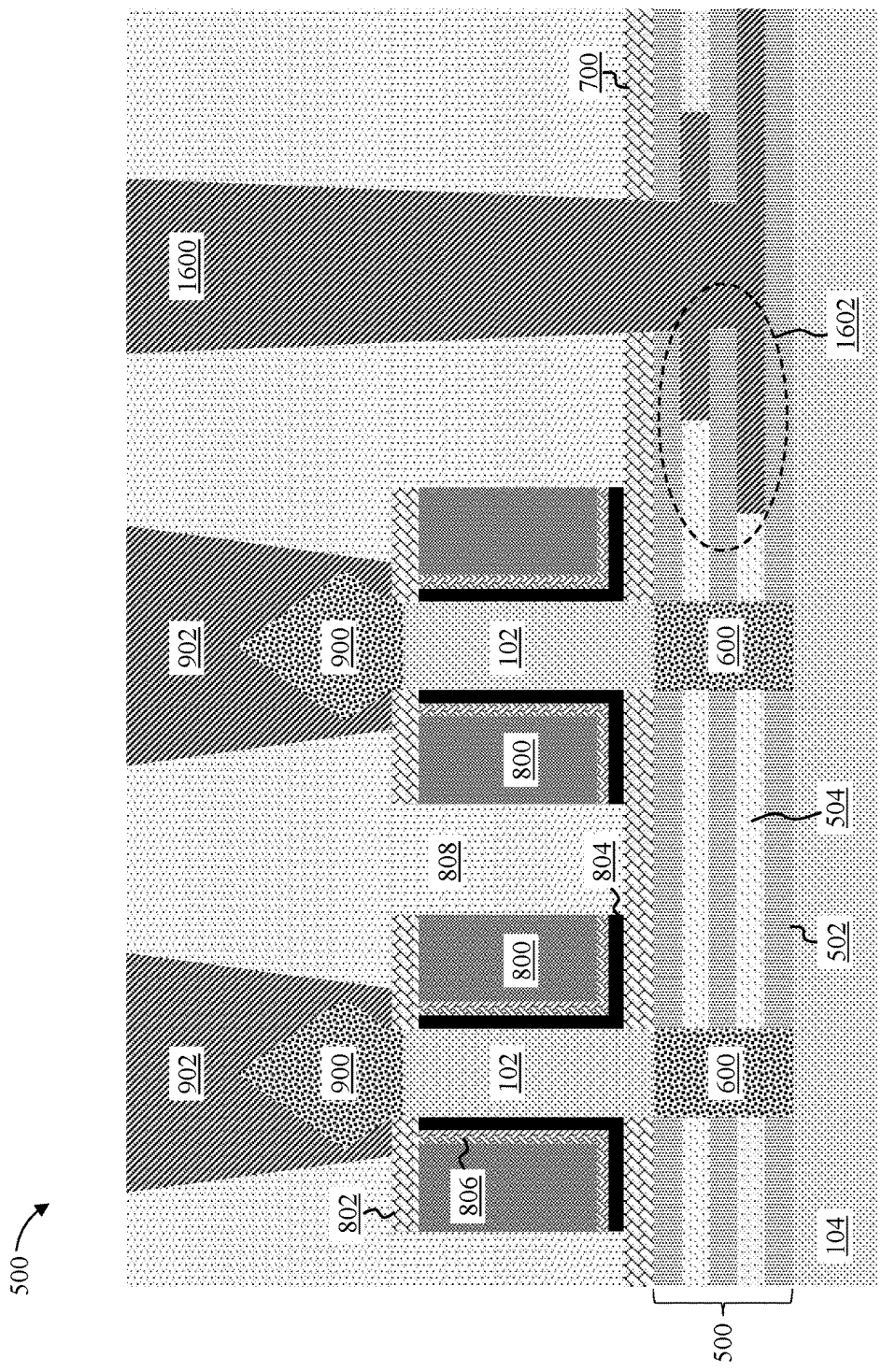
FIG. 16 depicts a cross-sectional view of the semiconductor structure after a processing operation according to one or more embodiments of the present invention.

FIG. 16 depicts a cross-sectional view of a structure 500 after forming a bottom S/D contact 1600 having differential flanges 1602 during an intermediate operation of a method of fabricating a semiconductor device according to one or more embodiments of the invention. As discussed previously herein, a germanium content of the bottommost doped sacrificial layer of the sacrificial layers 504 can be greater than a germanium content of the remaining sacrificial layers 504.

In some embodiments of the present invention, this increased germanium content is leveraged to form the bottom S/D contact 1600 having differential flanges 1602. As used herein, a contact having "differential flanges" refers to a contact having flanges of various lengths (various flange widths). Sacrificial layers having the highest germanium content are etched at the fastest rate while forming the cavities 1100. In some embodiments of the present invention, the germanium content of each of the sacrificial layers 504 is adjusted to tune the final cavity lengths prior to contact filling. In other words, a width of a first flange (corresponding to the bottommost sacrificial layer having a higher germanium content) can be longer than a width of a second flange (corresponding to the sacrificial layers 504 having a lower germanium content).

A bottom S/D contact 1600 having differential flanges 1602 can used in embodiments having high aspect ratio cavities 1100 (i.e., a thickness of the sacrificial layers 504 is much less than a width of the cavities 1100) to increase the mechanical stability of the structure 400 and to prevent pinch off. Moreover, forming differential flanges 1602 having a longest bottommost flange advantageously reduces parasitic capacitance between the differential flanges 1602 and the conductive gates 800.

Figure 17:
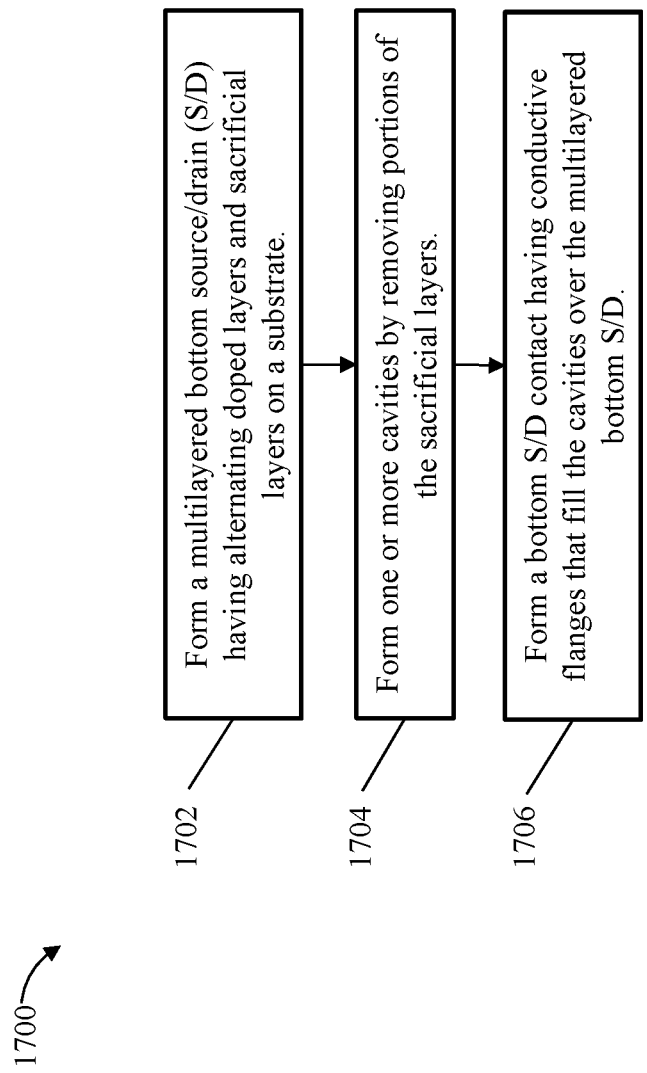
FIG. 17 depicts a flow diagram illustrating a method according to one or more embodiments of the invention.

FIG. 17 depicts a flow diagram 1700 illustrating a method for forming a semiconductor device according to one or more embodiments of the invention. As shown at block 1702, a multilayered bottom source/drain (S/D) having alternating doped layers and sacrificial layers is formed on a substrate. The multilayered bottom S/D can be formed in a similar manner as the multilayered bottom S/D depicted in FIG. 5 according to one or more embodiments.

As shown at block 1704, one or more cavities are formed by removing portions of the sacrificial layers. The cavities can be formed in a similar manner as the cavities 1100 depicted in FIG. 11 according to one or more embodiments.

As shown at block 1706, a bottom S/D contact having conductive flanges that fill the cavities is formed over the multilayered bottom S/D. The bottom S/D contact having conductive flanges can be formed according to one or more embodiments. For example, the bottom S/D contact having conductive flanges can be formed in a similar manner as the bottom S/D contact 1200 having contact flanges 1202 as depicted in FIG. 12. The bottom S/D contact can be a thin contact (as depicted in FIG. 13) according to one or more embodiments. The conductive flanges can be full length flanges (as depicted in FIG. 12), partial length flanges (as depicted in FIG. 14), thick flanges (as depicted in FIG. 15), or differential flanges (as depicted in FIG. 16) according to one or more embodiments.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and can not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a source/drain region comprising alternating doped layers and doped sacrificial layers on a substrate;
    removing portions of the doped sacrificial layers to form at least one cavity; and
    forming a contact over the source/drain region, said contact comprising at least one conductive flanges that fills at least one cavity.

2. The method of claim 1 further comprising forming a semiconductor fin on a substrate and adjacent to the source/drain region.

3. The method of claim 2 further comprising forming a conductive gate over a channel region of the semiconductor fin.

4. The method of claim 3 further comprising forming a bottom spacer between the source/drain region and the conductive gate.

5. The method of claim 4, wherein the at least one cavity extends beneath the conductive gate.

6. The method of claim 4, wherein the at least one cavity does not extend beneath the conductive gate.

7. The method of claim 1, wherein forming the at least one cavity further comprises removing portions of a doped layer of the source/drain region.

8. The method of claim 1, wherein the doped layers comprise silicon and the doped sacrificial layers comprise silicon germanium.

9. The method of claim 1, wherein a bottommost doped sacrificial layer of the source/drain region comprises a first germanium content and the remaining doped sacrificial layers of the source/drain region comprise a second germanium content.

10. The method of claim 9, wherein first germanium content is higher than the second germanium content.

11. The method of claim 1, wherein forming the at least one cavity by removing portions of the doped sacrificial layers further comprises laterally etching the doped sacrificial layers.

12. The method of claim 11, wherein the lateral etch comprises a gas phase etch process by hydrochloride (HCl) or a wet etch process by hydrogen peroxide ($H_2O_2$) or SC1.

13. The method of claim 10, wherein forming the contact further comprises varying an etching rate of an etching process that removes the portions of the doped sacrificial layers so as to tune a length of the at least one cavity.

14. A method for forming a semiconductor device, the method comprising:
    forming a semiconductor fin on a substrate;
    forming a multilayered source/drain region comprising alternating doped layers and doped sacrificial layers on the substrate;
    forming a conductive gate over a channel region of the semiconductor fin;
    forming a bottom spacer between the conductive gate and the multilayered source/drain doped region;
    doping a portion of the semiconductor fin between the bottom spacer and the substrate;
    removing portions of the doped sacrificial layers to form at least one cavity; and
    forming a contact over the multilayered source/drain doped region, said contact comprising at least one flange that fills the at least one cavity;
    wherein the at least one flange extends from the contact to the doped portion of the semiconductor fin.

15. The method of claim 14, wherein the doped layers comprise silicon and the doped sacrificial layers comprise silicon germanium.

16. The method of claim 15, wherein a bottommost doped sacrificial layer of the source/drain region comprises a first germanium content and remaining doped sacrificial layers of the source/drain region comprise a second germanium content, and
    wherein forming the contact further comprises varying an etching rate of an etching process that removes the portions of the doped sacrificial layers so as to tune a length of the at least one cavity.

17. A method for forming a semiconductor device, the method comprising:
    forming a semiconductor fin on a substrate;
    forming a source/drain region comprising alternating doped layers and doped sacrificial layers on the substrate;
    forming a bottom spacer on the source/drain region;
    doping a portion of the semiconductor fin between the bottom spacer and the substrate;
    removing portions of the doped sacrificial layers to form at least one cavity; and
    forming a bottom contact over the source/drain region, said bottom contact comprising at least one conductive flange that fills the at least one cavity;
    wherein a portion of the doped sacrificial layers remains between the at least one conductive flange and the doped portion of the semiconductor fin.

18. The method of claim 17, wherein the doped layers comprise silicon and the doped sacrificial layers comprise silicon germanium.

19. The method of claim 18, wherein a bottommost doped sacrificial layer of the source/drain region comprises a first germanium content and remaining doped sacrificial layers of the source/drain region comprise a second germanium content.

20. The method of claim 19, wherein forming the contact further comprises varying an etching rate of an etching process that removes the portions of the doped sacrificial layers so as to tune a length of the at least one cavity.

* * * * *